(12) United States Patent
Assaderaghi et al.

(10) Patent No.: US 6,252,429 B1
(45) Date of Patent: Jun. 26, 2001

(54) METHOD AND APPARATUS FOR IMPROVING DEVICE MATCHING AND SWITCHING POINT TOLERANCE IN SILICON-ON-INSULATOR CROSS-COUPLED CIRCUITS

(75) Inventors: Fariborz Assaderaghi, Mahopac; Ching-Te Kent Chuang, South Salem, both of NY (US); Jente Benedict Kuang, Lakeville, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/317,733

(22) Filed: May 24, 1999

(51) Int. Cl.⁷ ....................................................... G11C 7/06
(52) U.S. Cl. ................................................. 327/55; 327/51
(58) Field of Search .................................... 327/54, 55, 57, 327/64, 51, 77, 81, 534, 535; 326/31

(56) References Cited

U.S. PATENT DOCUMENTS 6,028,455 * 2/2000 Yamauchi ............................... 327/52
6,031,775 * 2/2000 Chang et al. ......................... 365/205
6,046,609 * 4/2000 Toyoshima et al. ................... 327/55

* cited by examiner

Primary Examiner—Tuan T. Lam
(74) Attorney, Agent, or Firm—Mark E. McBurney; Bracewell & Patterson, L.L.P.

(57) ABSTRACT

An apparatus for improving device matching and switching point tolerance in a silicon-on-insulator cross-coupled circuit is disclosed. The silicon-on-insulator circuit includes first and second sets of transistors, first and second rails, and first and second discharge transistors. The first set of transistors is cross-coupled with the second set of transistors. The first rail is connected to each gate of the transistors in the first set, and the second rail is connected to each gate of the transistors in the second set. The body of at least one transistor within the first set of transistors is connected to the first discharge transistor having the same channel type as the connected transistor. The body of at least one transistor within the second set of transistors is connected to the second discharge transistor having the same channel type as the connected transistor. The gate of the first discharge transistor is controlled by the second rail, and the gate of the second discharge transistor is controlled by the first rail.

17 Claims, 4 Drawing Sheets

METHOD AND APPARATUS FOR IMPROVING DEVICE MATCHING AND SWITCHING POINT TOLERANCE IN SILICON-ON-INSULATOR CROSS-COUPLED CIRCUITS

BACKGROUND OF THE INVENTION

1. Technical Field

The present invention relates to silicon-on-insulator circuits in general, and in particular to a method and apparatus for improving silicon-on-insulator complementary metal-oxide-semiconductor circuits. Still more particularly, the present invention relates to a method and apparatus for improving device matching and switching point tolerance in silicon-on-insulator cross-coupled complementary metal-oxide-semiconductor circuits.

2. Description of the Prior Art

In recent years, the predominant processing technology for integrated circuits has been the bulk complementary metal-oxide-semiconductor (CMOS) technology using silicon as substrates. Although bulk CMOS technology offers various advantages, such as low power consumption and stability, over other types of processing technologies, there are also several drawbacks associated with CMOS circuits, such as relatively slow speed and potential latchup problem. In light of such, a new processing technology called Silicon-on-Insulator (SOI) technology has emerged. Instead of using an semiconductor substrate like the bulk CMOS technology, SOI utilizes an insulating substrate, which provides tremendous improvements in certain circuit characteristics, such as speed and latch-up, over bulk CMOS technology. A detailed description of SOI technology can be found in Weste and Eshraghian, *Principles of CMOS VLSI Design: A Systems Perspective*, 2nd ed., pp. 125–130, Addison Wesley (1995), the pertinent portion of which is incorporated herein by reference.

For SOI circuits having transistors in a dual-rail cross-coupled configuration, mismatch and lack of symmetry of transistors on each rail can be attributed to body potential or threshold voltage differentials in transistor characteristics. The body potential is dependent upon the operating history of a circuit. The mismatch and lack of symmetry is also a direct result of dissimilar time constants to discharge the bodies of the transistors compared to the actual circuit access or cycle times. This disclosure describes an apparatus for improving device matching and switching point tolerance in SOI cross-coupled circuits.

SUMMARY OF THE INVENTION

In accordance with a preferred embodiment of the present invention, a silicon-on-insulator circuit includes first and second sets of transistors, first and second rails, and first and second discharge transistors. The first set of transistors is cross-coupled with the second set of transistors. The first rail is connected to each gate of the transistors in the first set, and the second rail is connected to each gate of the transistors in the second set. The body of at least one transistor within the first set of transistors is connected to the first discharge transistor having the same channel type as the connected transistor. The body of at least one transistor within the second set of transistors is connected to the second discharge transistor having the same channel type as the connected transistor. The gate of the first discharge transistor is controlled by the second rail, and the gate of the second discharge transistor is controlled by the first rail.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
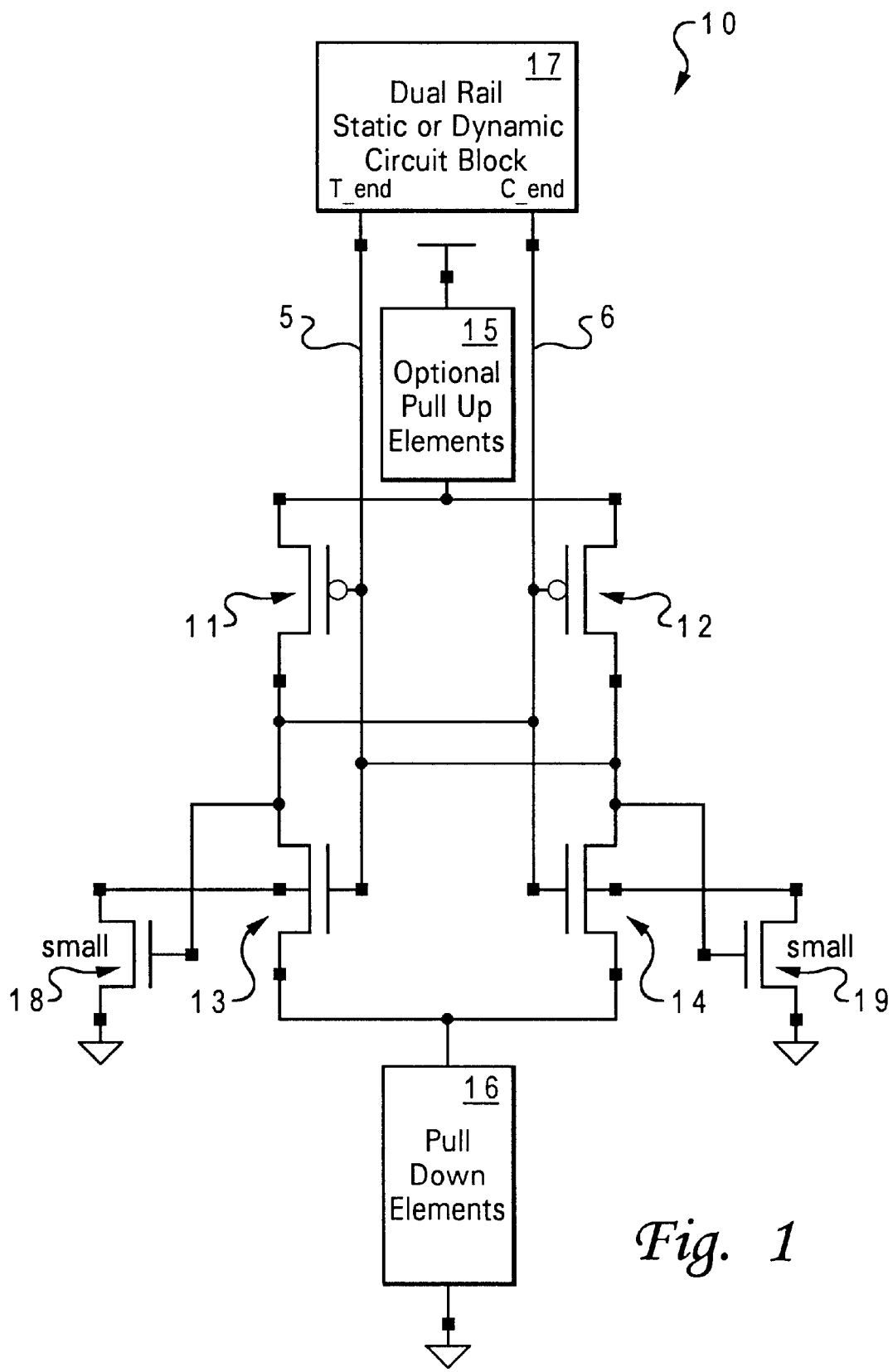
FIG. 1 is a dual-rail cross-coupled circuit having a balanced n-channel transistor configuration in accordance with a preferred embodiment of the present invention.

The principle of the present invention is illustrated by way of a dual-rail cross-coupled circuit, and it is understood by those skilled in the art that the present invention is also applicable to other similar types of circuits. Referring now to the drawings and in particular to FIG. 1, there is depicted a dual-rail cross-coupled circuit having a balanced n-channel transistor configuration in accordance with a preferred embodiment of the present invention. Circuit 10 is fabricated with silicon-on-insulator (SOI) complementary-metal-oxide semiconductor (CMOS) technology.

As shown, circuit 10 includes two p-channel transistors 11, 12 and two n-channel transistors 13, 14 cross-coupled to each other. Specifically, the gates of transistors 11, 13 are connected to the drain of transistors 12, 14, and the gates of transistors 12, 14 are connected to the drains of transistors 11, 13. In addition, the gates of transistors 11 and 13 are connected to a control line 5 of a dual-rail circuit block 17, and the gates of transistors 12 and 14 are connected to a control line 6 of dual-rail circuit block 17. The signal polarity of control line 5 and control line 6 are complementary to each other. Dual-rail circuit block 17 can be a static circuit block or a dynamic circuit block. A pull-down elements block 16 is coupled between cross-coupled transistors 11–14 and ground. Similarly, an optional pull-up elements block 15 can be added between a power supply (i.e., $V_{dd}$) and cross-coupled transistors 11–14.

In accordance with a preferred embodiment of the present invention, each concerned transistor (i.e., a floating-body transistor that is susceptible to voltage drifting in a dual-rail cross-coupled circuit is body-contacted through a tiny discharge transistor of the same channel type of the concerned transistor. The gate of the tiny discharge transistor is controlled by the opposite rail of the signal line. For example, in FIG. 1, two small n-channel transistors 18 and 19 serve as the discharge transistors for two body-contacted n-channel transistors 13 and 14, respectively, on both sides of the dual-rail structure. The gate of transistor 13 is controlled by control line 6, while the gate of transistor 14 is controlled by control line 5.

During operation, if the gate voltage of a body-contacted transistor, such as transistor 13 and/or transistor 14, is rising (turning on), the gate voltage of the discharge transistor, such as transistor 18 and/or transistor 19, will be falling (turning off), thereby reducing the discharge speed and further aiding the turning on of the concerned transistor. If the gate voltage of the concerned transistor is falling, the gate voltage of the discharge transistor will be rising, thereby increasing the body discharge as well as the threshold voltage and further aiding the turning off of the concerned transistor.

The addition of discharge transistor 18 to transistor 13 (and the addition of discharge transistor 19 to transistor 14) also conveniently solves the initial cycle parasitic bipolar leakage problem simultaneously for several circuit families. Because when the concerned transistor 13 has $V_g$=ground and $V_d$=$V_s$=a high voltage, the body of transistor 13 is grounded with the help of discharge transistor 18. As a result, an undesirable parasitic NPN transistor bias condition is prevented. When circuit 10 is at its mid (high gain) point, the topological arrangement enables perfect device matching through the additional symmetrical discharge paths (as well as layout and device size matching), which function under time constants in the same order of magnitude as the rest of circuit 10. With the discharge transistors being turned on at every cycle, perfect device matching can be achieved due to the absence of charge accumulation caused by charge pumping at every cycle.

Figure 2:
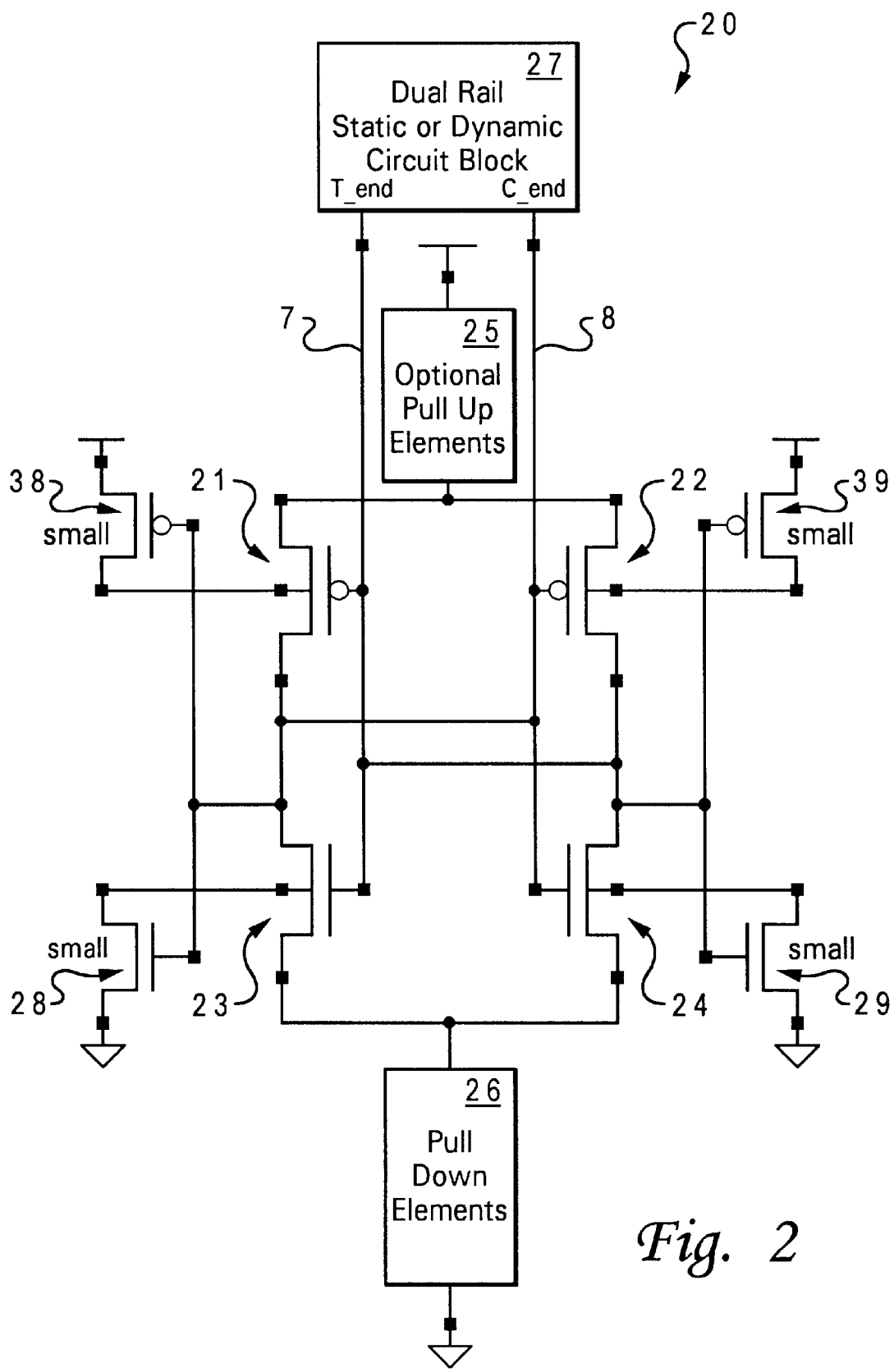
FIG. 2 is a dual-rail cross-coupled circuit having a full balanced configuration in accordance with a preferred embodiment of the present invention.

With reference now to FIG. 2, there is depicted a dual-rail cross-coupled circuit having a full balanced configuration in accordance with a preferred embodiment of the present invention. Similar to circuit 10, circuit 20 includes two p-channel transistors 21, 22 and two n-channel transistors 23, 24 cross-coupled to each other. The gates of transistors 21 and 23 are connected to a control line 7 of a dual-rail circuit block 27, and the gates of transistors 22 and 24 are connected to a control line 8 of dual-rail circuit block 27. Control line 7 and control line 8 are complementary to each other. Dual-rail circuit block 27 can 12 be a static circuit block or a dynamic circuit block. A pull-down element block 26 is coupled between cross-coupled transistors 11–14 and ground, and an optional pull-up elements block 25 is added between a power supply (i.e., $V_{dd}$) and cross-coupled transistors 21–24.

In addition, two small n-channel transistors 28 and 29 serve as the discharge transistors to two concerned n-channel transistors 23 and 24, respectively, on both sides of the dual rail structure. The gate of transistor 23 is controlled by control line 8, and the gate of transistor 24 is controlled by control line 7. Similarly, two small p-channel transistors 38 and 39 serve as the discharge devices for two concerned p-channel transistors 21 and 22, respectively, on both sides of the dual rail structure. The gate of transistor 38 is controlled by control line 8, and the gate of transistor 39 is controlled by control line 7.

The full balanced configuration as shown in FIG. 2 is intended for dual-rail cross-coupled circuits that require more precise matching.

Figure 3:
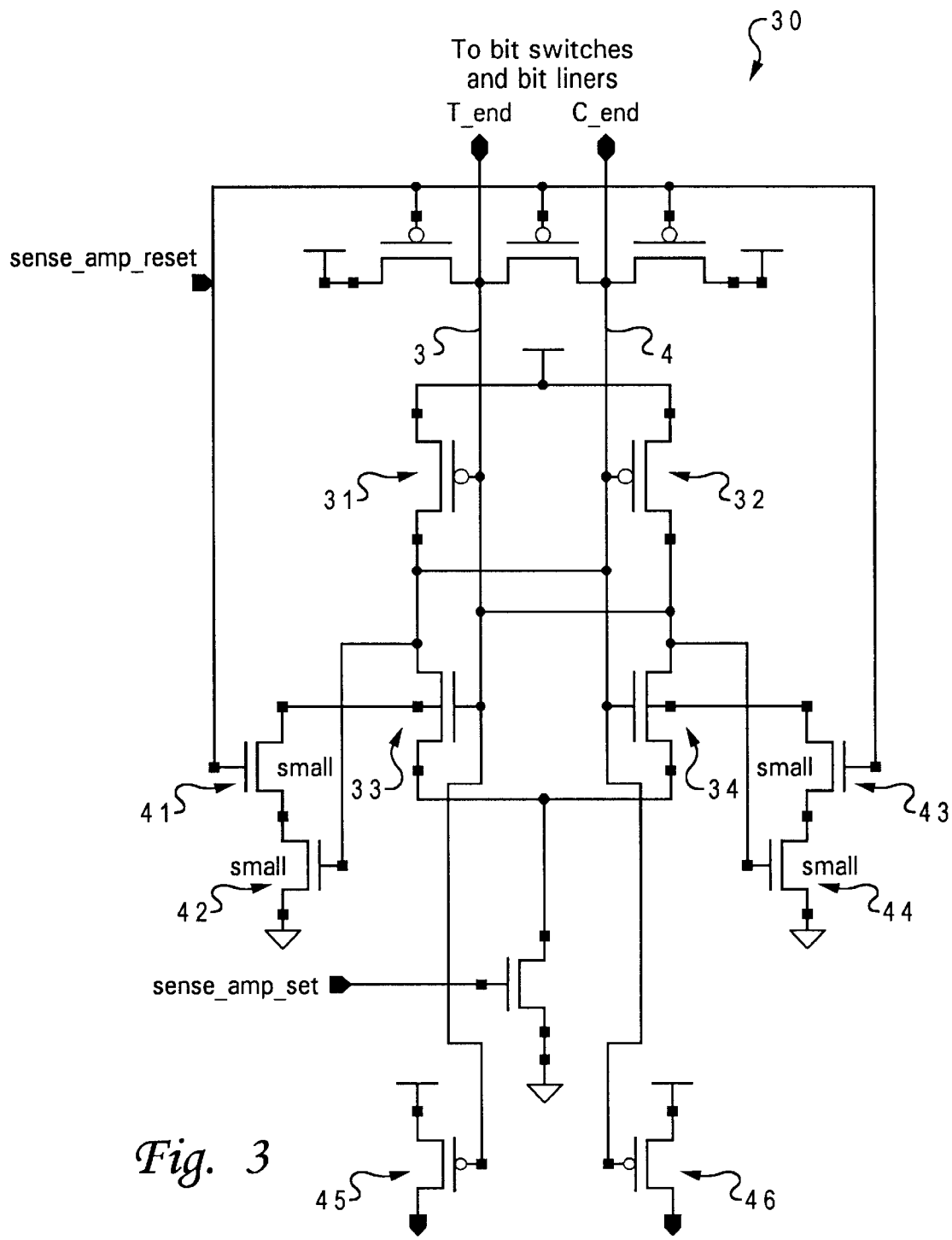
FIG. 3 is an exemplary latch-type sense amplifier utilizing the balanced n-channel transistor configuration in so accordance with a preferred embodiment of the present invention.

Referring now to FIG. 3, there is depicted an exemplary latch-type sense amplifier utilizing the balanced n-channel transistor configuration in accordance with a preferred embodiment of the present invention. Circuit 30 includes two p-channel transistors 31, 32 and two n-channel transistors 33, 34 cross-coupled to each other. With circuit 30, repetitive sense amplifier read operation using biased data patterns can have the effect of asymmetric charge accumulation on the sense amplifier devices (not shown) when the body of transistors 33 and 34 are left free floating. Thus, a balanced n-channel transistor configuration similar to the one shown in FIG. 1 is utilized to prevent asymmetric charge accumulation As shown in FIG. 3, two small n-channel transistors 41 and 42, instead of one transistor as depicted in FIG. 1, serve as discharge devices to concerned n-channel transistor 33. Similarly, two small n-channel transistors 43 and 44 serve as discharge devices to concerned n-channel transistor 34. The gate of transistor 42 is controlled by control line 4, and the gate of transistor 44 is controlled by control line 3. The gates of both transistors 41 and 43 are controlled by a sense_amp_reset signal.

During a sensing operation (when sense_amp_reset =1 and sense_amp_set =1), discharge transistors 41 and 44 are enabled for matching improvement. During a bitline restore operation (when sense_amp_reset =0 and sense_amp_set =0), discharge transistors 41 and 44 are turned off for faster returning to precharged condition at complementary bitlines. The same dynamic body discharge technique as utilized in transistors 33 and 34 can also be employed for transistors 45 and 46 on the data-out path for better matching precision.

Both concerned n-channel transistors 33 and 34 require good I–V matching characteristics, thus these two devices are most often designed with channel lengths longer than the design rule minimum to circumvent fabrication related mismatch.

Figure 4:
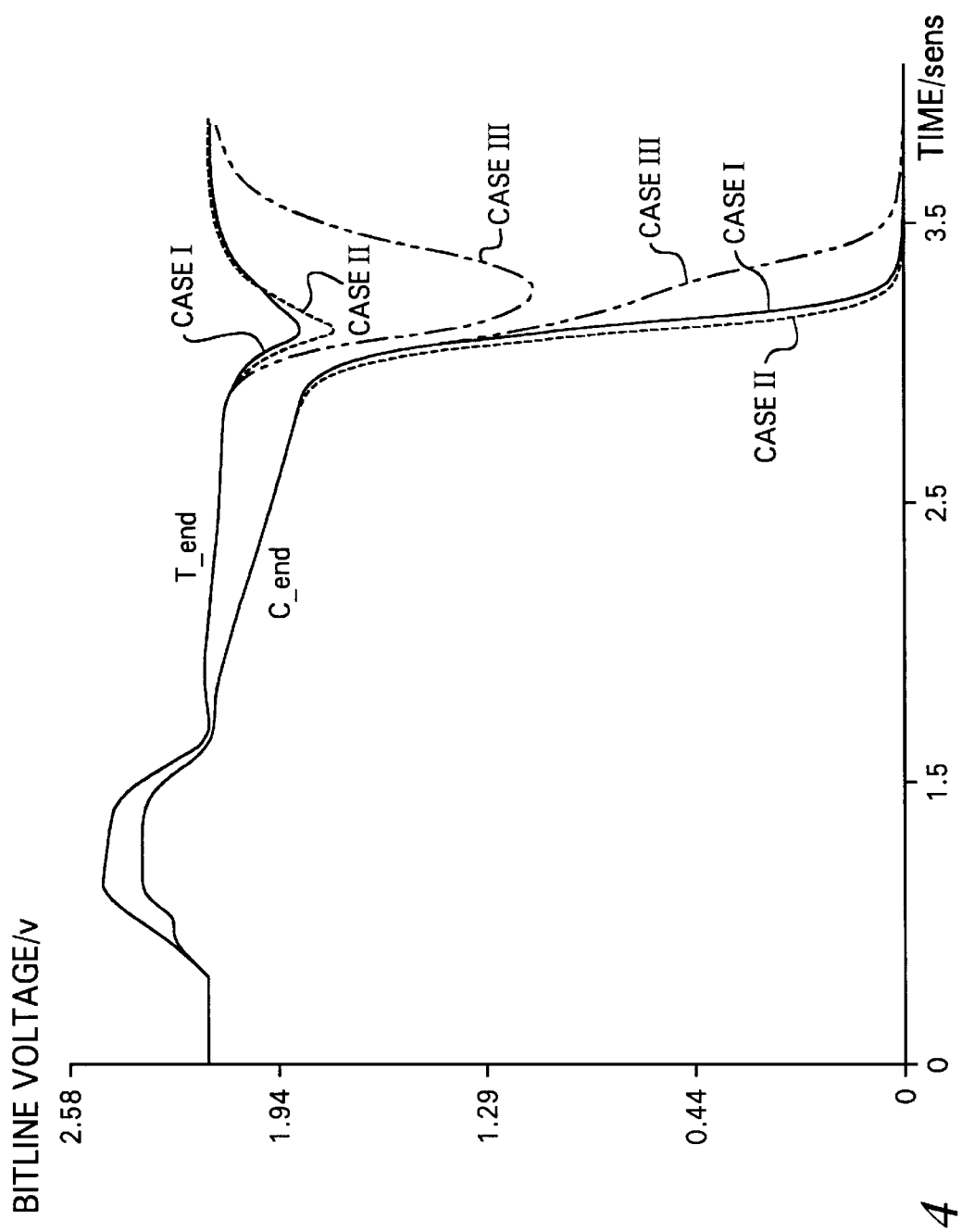
FIG. 4 is a depiction of various simulation waveforms of the circuit from FIG. 3 and a conventional circuit.

With reference now to FIG. 4, there is depicted three sets of simulation results for circuit 30 of FIG. 3. T_end and C_end are the dual rail bitlines of circuit 30. Case I is the implementation of two discharge transistors 41, 42 on transistor 33 and two discharge transistors 43, 44 on transistor 34 (the present invention), with an artificial initial body potential difference of 0.7V. Case II depicts the situation when the body of both transistors 33 and 34 are left floating with 0V initial body voltage difference (a conventional implementation with no body potential mismatch, i.e., an ideal case). Case III depicts the situation when the body of both transistors 33 and 34 are left floating with 0.7V initial body voltage difference (a conventional implementation with a body potential mismatch of 0.7V). Case III mimics a condition where body potentials have been significantly biased due to operation history and a read operation tries to sense data of opposite (unfavorable) polarity.

As indicated by the waveform of Case I, the present invention results in a bitline voltage differential |T_end–C_end|, switching speed, and noise margin similar to Case II-a perfectly matched (ideal) case of the conventional implementation. The result of Case I is still very favorable even though a mismatch of 0.7V has been artificially imposed on the bodies of the two concerned n-channel transistors in the simulation. With the same 0.7V body voltage mismatch on a conventional implementation, Case III suffers severe noise and performance degradation. The waveform of Case III indicates a much reduced bitline voltage differential, which leads to a lower noise margin and speed degradation.

As has been described, the present invention provides an improved method for addressing body history problems induced by device mismatching in dual-rail SOI circuits where matching of transfer characteristics are of critical importance. The disclosed principle is applicable to a wide range of dual-rail cross-coupled circuits, such as static or dynamic cascade voltage switch logic (CVSL), latch-type sense amplifier, and various types of operational amplifiers for analog applications.

The present invention also has the advantage of retaining a significant degree of the floating body nature even in the presence of body contacts, thereby maintaining a desirable speed advantage while not suffering from initial cycle speed degradation (i.e., excessive parasitic bipolar current during start of first cycle) or bulk-like syndrome (i.e., body tied to ground or a field effect transistor source resulting in higher threshold voltage and hence slower transition). This is because the body of a concerned transistor is only fully discharged when its gate is at 0V and its drain is at a high potential, thus no high-current bias condition is allowed for parasitic bipolar transistors. Otherwise, the body of the concerned transistor is left truly floating (when the discharge transistor is fully on) or pseudo-floating (under all other conditions).

While the invention has been particularly shown and described with reference to a preferred embodiment, it will be understood by those skilled in the art that various changes in form and detail may be made therein without departing from the spirit and scope of the invention.

What is claimed is:

1. A silicon-on-insulator circuit, comprising:
   a first set of transistors cross-coupled with a second set of transistors;
   a first rail connected to each gate of said first set of transistors;
   a second rail connected to each gate of said second set of transistors; and
   a drain of a first discharge transistor connected only to a body of at least one transistor within said first set of transistors, wherein said first discharge transistor is of an identical channel type of at least one transistor within said first set of transistors, wherein a gate of said first discharge transistor is controlled by said second rail.

2. The silicon-on-insulator circuit according to claim 1, wherein said first rail is complementary to said second rail.

3. The silicon-on-insulator circuit according to claim 1, wherein said first set of transistors includes a plurality of p-channel transistors and a plurality of n-channel transistors.

4. The silicon-on-insulator circuit according to claim 1, wherein said second set of transistors includes a plurality of p-channel transistors and a plurality of n-channel transistors.

5. The silicon-on-insulator circuit according to claim 1, wherein said silicon-on-insulator circuit further includes a drain of a second discharge transistor connected only to a body of said at least one transistor within said second set of transistors, wherein said second discharge transistor is of an identical channel type of at least one transistor within said second set of transistors, wherein a gate of said second discharge transistor is controlled by said first rail.

6. The silicon-on-insulator circuit according to claim 1, wherein said transistors are silicon-on-insulator transistors.

7. A method for providing device matching and switching point tolerance in a silicon-on-insulator cross-coupled circuit, wherein said silicon-on-insulator cross-coupled circuit includes a first set of transistors cross-coupled with a second set of transistors, a first rail connected to each gate of said first set of transistors, and a second rail connected to each gate of said second set of transistors, wherein said first rail is complementary to said second rail, said method comprising the steps of:
   connecting a drain of a first discharge transistor only to a body of at least one transistor within said first set of transistors, wherein said first discharge transistor is of an identical channel type of at least one transistor within said first set of transistors, wherein a gate of said first discharge transistor is controlled by said second rail; and
   connecting a drain of a second discharge transistor only to a body of at least one transistor within said second set of transistors, wherein said second discharge transistor is of an identical channel type of at least one transistor within said second set of transistors, wherein a gate of said second discharge transistor is controlled by said first rail.

8. The method according to claim 7, wherein said first set of transistors includes a plurality of p-channel transistors and a plurality of n-channel transistors.

9. The method according to claim 7, wherein said second set of transistors includes a plurality of p-channel transistors and a plurality of n-channel transistors.

10. The method according to claim 7, wherein said transistors are silicon-on-insulator transistors.

11. A silicon-on-insulator circuit, comprising:
    a first set of transistors cross-coupled with a second set of transistors;
    a first rail connected to each gate of said first set of transistors;
    a second rail connected to each gate of said second set of transistors; and
    a first and second discharge transistors connected to a body of at least one transistor within said first set of transistors, wherein said first and second discharge transistors are connected in series, wherein a drain of said first discharge transistor connected only to a body of at least one transistor within said first set of transistors, wherein said first and second discharge transistors are of an identical channel type of at least one transistor within said first set of transistors, wherein a gate of said first discharge transistor is controlled by said second rail.

12. The silicon-on-insulator circuit according to claim 11, wherein said transistors are silicon-on-insulator transistors.

13. The silicon-on-insulator circuit according to claim 11, wherein said first rail is complementary to said second rail.

14. The silicon-on-insulator circuit according to claim 11, wherein said first set of transistors includes a plurality of p-channel transistors and a plurality of n-channel transistors.

15. The silicon-on-insulator circuit according to claim 11, wherein said second set of transistors includes a plurality of p-channel transistors and a plurality of n-channel transistors.

16. The silicon-on-insulator circuit according to claim 11, wherein said silicon-on-insulator circuit further includes a third and fourth discharge transistors connected to a body of at least one transistor within said second set of transistors, wherein said third and fourth discharge transistors are connected in series, wherein a drain of said third discharge transistor connected only to a body of at least one transistor within said second set of transistors, wherein said third and fourth discharge transistors are of an identical channel type of at least one transistor within said second set of transistors, wherein a gate of said third discharge transistor is controlled by said first rail.

17. The silicon-on-insulator circuit of claim 16, wherein the sizes of said first, second, third, and fourth discharge transistors are smaller than other transistors.

* * * * *

UNITED STATES PATENT AND TRADEMARK OFFICE
CERTIFICATE OF CORRECTION

PATENT NO. : 6,252,429 B1
DATED : June 26, 2001
INVENTOR(S) : Assaderaghi et al.

It is certified that error appears in the above-identified patent and that said Letters Patent is hereby corrected as shown below:

<u>Column 2,</u>
Line 52, delete "transistor that is susceptible to voltage drifting in a dual-rail" and replace with -- transistor that is susceptible to voltage drifting) in a dual-rail --.

Signed and Sealed this

Twenty-sixth Day of March, 2002

*Attest:*

JAMES E. ROGAN
*Attesting Officer*       *Director of the United States Patent and Trademark Office*